(12) United States Patent
Lee et al.

(10) Patent No.: US 6,815,250 B1
(45) Date of Patent: Nov. 9, 2004

(54) METHOD FOR MANUFACTURING INFRARED DETECTOR USING DIFFUSION OF HYDROGEN PLASMA

(75) Inventors: Hee Chul Lee, Daejeon (KR); Ki Dong Yang, Busan (KR)

(73) Assignee: Agency for Defense Development, Daejeon (KR)

( * ) Notice: Subject to any disclaimer, the term of this patent is extended or adjusted under 35 U.S.C. 154(b) by 0 days.

(21) Appl. No.: 10/342,864

(22) Filed: Jan. 15, 2003

(30) Foreign Application Priority Data

Jan. 22, 2002 (KR) .............................. 10-2002-0003706

(51) Int. Cl.$^7$ .............................................. H01L 21/00
(52) U.S. Cl. ........................ 438/84; 438/102; 257/188
(58) Field of Search .......................... 438/84, 102, 95, 438/603, 513, 798, 77, 93, 94, 520, 528, 918, 57; 257/188, 442, 614, 447, 460, 461, 183

(56) References Cited

U.S. PATENT DOCUMENTS

| | | | | |
|---|---|---|---|---|
| 5,318,666 A | * | 6/1994 | Elkind et al. ............... | 156/643 |
| 5,646,426 A | * | 7/1997 | Cockrum et al. ........... | 257/188 |
| 5,851,906 A | * | 12/1998 | Mizuno et al. ............. | 438/513 |
| 2003/0034537 A1 | * | 2/2003 | Shigenaka et al. .......... | 257/442 |

* cited by examiner

Primary Examiner—W. David Coleman
(74) Attorney, Agent, or Firm—Scully, Scott, Murphy & Presser

(57) ABSTRACT

A method for manufacturing an infrared detector forms a p-n junction by forming a low concentration p type HgCdTe layer, forming a diffusion preventing layer for exposing some upper part of the low concentration p type HgCdTe layer, and by forming a low concentration n type HgCdTe layer by diffusing hydrogen ions and atoms to the low concentration p type HgCdTe layer using hydrogen plasma. The hydrogen ions or atoms are diffused on some of the low concentration p type HgCdTe layer to be a predetermined depth using the hydrogen plasma to form the low concentration n type HgCdTe layer in order to prevent an interface of the p-n junction from damaging, and thereby leakage current can be prevented, fabrication cost is not increased and yield is increased due to simple processes.

6 Claims, 5 Drawing Sheets

METHOD FOR MANUFACTURING INFRARED DETECTOR USING DIFFUSION OF HYDROGEN PLASMA

BACKGROUND OF THE INVENTION

1. Field of the Invention

The present invention relates to a method for manufacturing an infrared detector, and particularly, to a method for manufacturing an infrared detector which is suitable for manufacturing a photovoltaic type infrared detector by realizing p-n junction on an HgCdTe substrate without a damage using a diffusion method using hydrogen plasma.

2. Description of the Background Art

Generally, a device detecting infrared ray can be divided into a photoconductive type infrared detector which detects a change of conductive according to irradiation of infrared ray, and a photovoltaic type infrared detector which detects a change of voltage or current according to application of infrared ray.

The photovoltaic type infrared detector forms a p-n junction of $Hg_{1-x}Cd_xTe$, and separates electric charges which are generated by light through an electric field formed on the junction part to detect the infrared ray.

The above $Hg_{1-x}Cd_x$ Te is a material having the highest detectivity for the infrared ray, and is able to detect the infrared ray of desired wavelength selectively by changing composition (x).

There are conventional methods for manufacturing photovoltaic type infrared detector, that is, a method forming the p-n junction during growing an HdCdTe substrate, a method forming the junction using ionic acceleration by the plasma, and a method using ion implantation.

The method of forming p-n junction with the growth of the HgCdTe substrate forms an n type HgCdTe area in a p type HgCdTe substrate by controlling concentration of carrier during growing the HgCdTe on an upper part of a transparent substrate.

As described above, in order to form junction parts of different conductive types during the growing process of the HgCdTe by controlling the concentration of impurities, the junction is formed on entire surface of a wafer by controlling the concentration of the carrier using a metal organic chemical vapor deposition (MOCVD) method or molecular beam epitaxy (MBE) method.

The above methods form a low concentration n type HgCdTe layer on an upper surface of low concentration p type HgCdTe substrate, and cuts the substrate into unit devices after manufacturing it.

According to the above method, stable p-n junction can be formed without leakage current, however, the processes such as dividing into unit devices are complex and the cost of the vapor deposition method is high, and thereby unit cost of manufacturing is increased.

Also, according to the above method, it is difficult to realize a planar structure, and therefore, it is difficult to realize the infrared detector of two-dimensional focal plane array.

Second method for forming the junction on the HgCdTe substrate is that plasma is formed by mixing methane ($CH_4$) used to etch the HdCdTe and hydrogen gas, and the junction is formed using the plasma. After mixing the methane gas and the hydrogen gas, the ions are accelerated by the plasma, and then, the accelerated ions damage some of the p type HdCdTe substrate. As the HdCdTe substrate is damaged by the accelerated ions, the hydrogen ions are injected into the substrate, and thereby, the n type area is formed on the substrate. However, the above method damages the substrate, and causes the leakage current after manufacturing the device.

The last method is the ion implantation method used in semiconductor processes, for forming the junction on the HgCdTe substrate. The method using the ion implantation process forms the p type HgCdTe substrate, exposes a certain area of the HgCdTe substrate, and changes the conductive type by implanting n type impurity ions into the exposed area.

The ion implantation method as above is able to form the infrared detector array in a plane structure easily, however, heat treatment process which is the post-process after the ion implantation activates the ions, and therefore, the uniform device can not be formed. Also, this method damages the HgCdTe substrate as the ion implantation method, and therefore, the leakage current may be generated.

As described above, according to the conventional methods for forming the infrared detector, the manufacturing cost is high, or the HgCdTe substrate is damaged as the p-n junction is formed. Therefore, the leakage current may be generated when the infrared detector is operated, and the properties are degraded.

SUMMARY OF THE INVENTION

Therefore, an object of the present invention is to provide a method for manufacturing an infrared detector which does not damage an HgCdTe substrate of a photovoltaic type infrared detector, and can be manufactured with low manufacturing cost.

To achieve the object of the present invention, as embodied and broadly described herein, there is provided a method for manufacturing an infrared detector comprising the steps of: forming a low concentration p type HgCdTe layer on an upper part of a transparent substrate; forming a diffusion preventing layer with some part exposed on the low concentration p type HgCdTe layer; forming a low concentration n type HgCdTe layer by diffusing hydrogen ions and atoms to the exposed low concentration p type HgCdTe layer using hydrogen plasma, and forming a p-n junction; removing the diffusion preventing layer, and forming an insulating layer on entire upper surfaces of the low concentration p type HgCdTe layer and the low concentration n type HgCdTe layer; forming a contact hole on the insulating layer so as to expose some upper surfaces of the low concentration p type HgCdTe layer and the low concentration n type HgCdTe layer; forming plugs contacted to upper parts of the low concentration p type HgCdTe layer and the low concentration n type HgCdTe layer in the contact holes; and forming a pad contacted to the respective plugs and located on some upper part of the insulating layer to be a predetermined area by depositing and patterning the metal layer on the entire upper surface of the above structure.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 1a through 1f are cross-sectional views showing processes for manufacturing an infrared detector according to the present invention.

Figure 1A:
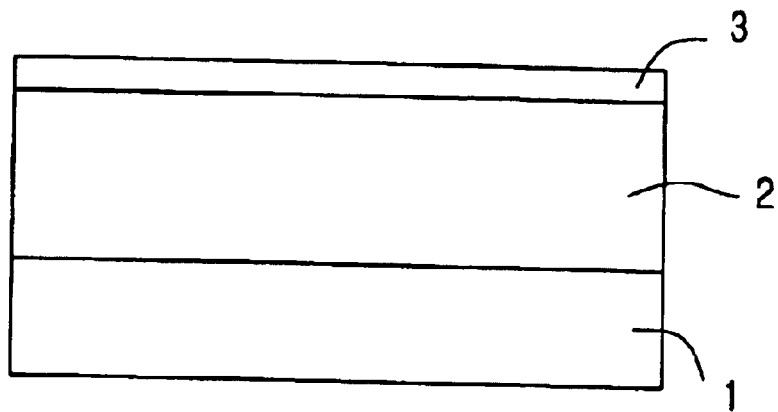
FIGS. 1a through 1f are cross-sectional view showing manufacturing processes of an infrared detector according to the present invention.
Figure 1B:
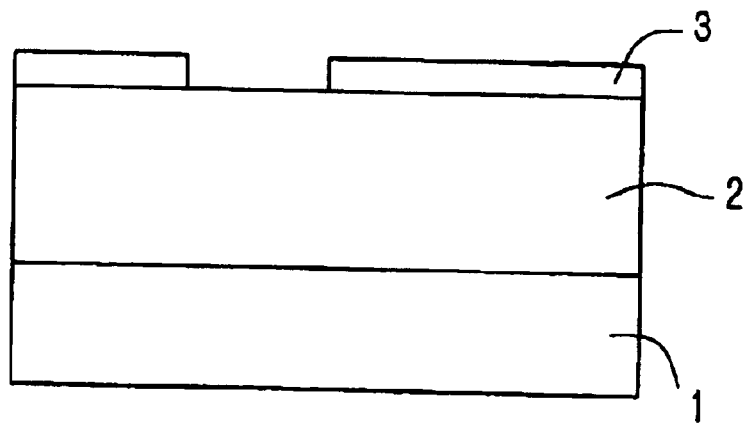
Figure 1C:
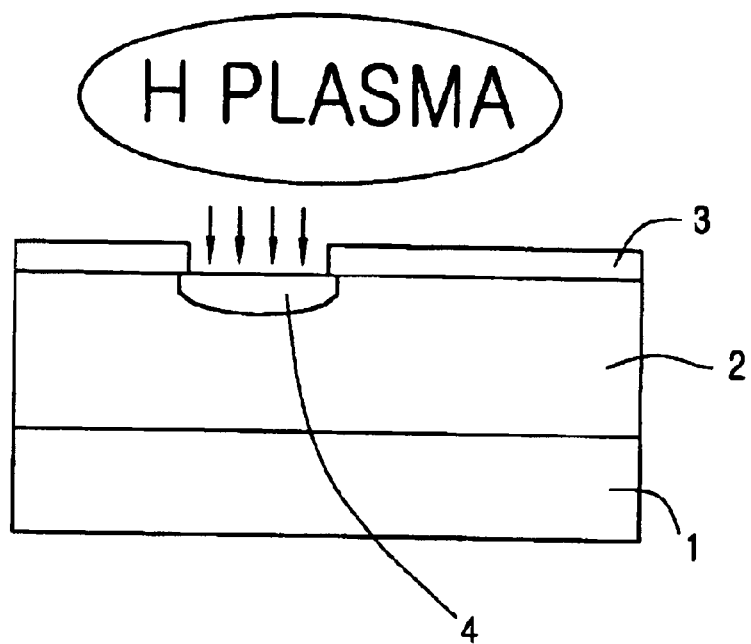
Figure 1D:
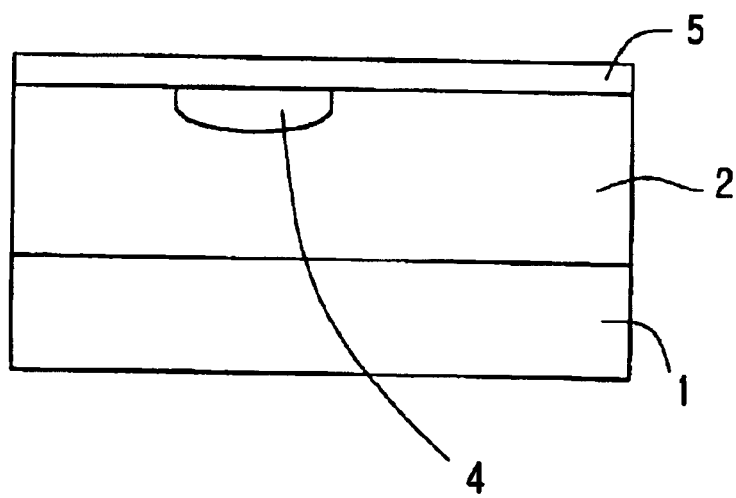
Figure 1E:
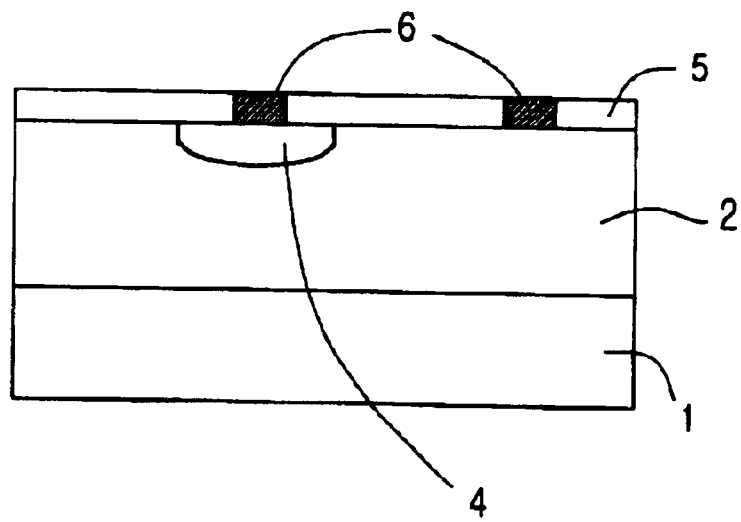
Figure 1F:
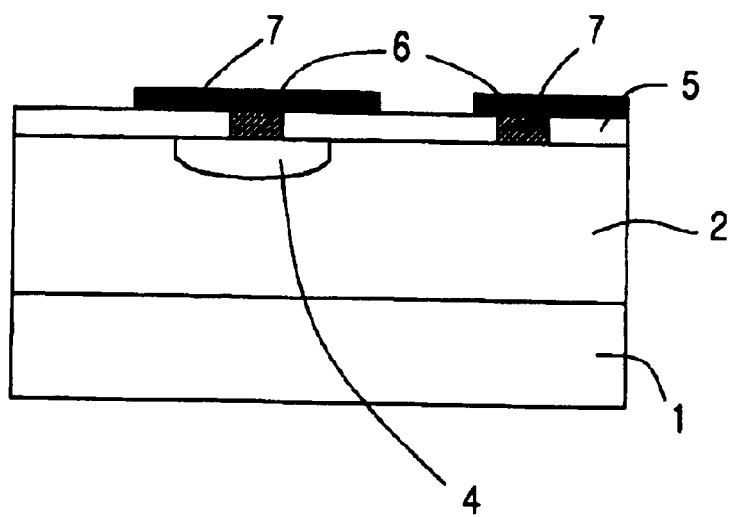

As shown therein, the method for manufacturing the infrared detector according to the present invention comprises: a step of forming a low-concentration p type HgCdTe layer 2 on an upper part of a transparent substrate 1, and forming a passivation layer 3 on entire upper surface of the low-concentration p type HgCdTe layer (FIG. 1a); a step of removing some part of the passivation layer 3 to expose some upper part of the low concentration p type HgCdTe layer 2 on a lower part of the passivation layer 3 (FIG. 1b); a step of forming a low concentration n type HgCdTe layer 4 by diffusing hydrogen ions formed by a plasma to the exposed low concentration p type HgCdTe layer 2, and forming a p-n junction (FIG. c); a step of removing the passivation layer 3 and forming an insulating layer 5 on entire upper surface of the low concentration p type and low concentration n type HgCdTe layers 2 and 4 (FIG. 1d); a step of exposing some upper part of the HgCdTe layer 2 on which the junction of the low concentration p type and the low concentration n type HgCdTe layer 2 and 4 by removing some of the insulating layer 5, and forming a metal layer 6 on the exposed surface (FIG. 1e; and a step of forming a pad 7 contacted to the metal layer 6 by depositing and patterning a metal on the entire upper surface of the above structure.

Hereinafter, the method for manufacturing the infrared detector according to the present invention will be described as follows.

To begin with, as shown in FIG. 1a, the low concentration p type HgCdTe layer 2 is deposited on the upper part of the transparent substrate 1.

The transparent substrate 1 is CdZnTe or CdTe.

Next, ZnS is deposited on entire upper surface of the low concentration p type HgCdTe layer 2 in thermal evaporation method to form the passivation layer 3.

Then, some of the passivation layer 3 is etched using a photolithography process as shown in FIG. 1b.

Therefore, some of upper part on the low concentration p type HgCdTe layer 2 is exposed by the above etching process.

The ZnS is used as an example of the passivation layer 3, however, anything can be used as the passivation layer if it has higher adhesiveness with the low concentration p type HgCdTe layer 2 can be removed by selective etching process, and can prevent the hydrogen ions or atoms from diffusing.

As another examples of the passivation layer 3, CdTe or CdZnTe can be used.

Next, as shown in FIG. 1c, the hydrogen ions or atoms are diffused into the exposed low concentration p type HgCdTe layer 2 using the hydrogen plasma to form the low concentration n type HgCdTe layer 4, and thereby, the p-n junction is formed.

The method of diffusing the hydrogen atoms will be described in more detail.

Figure 2:
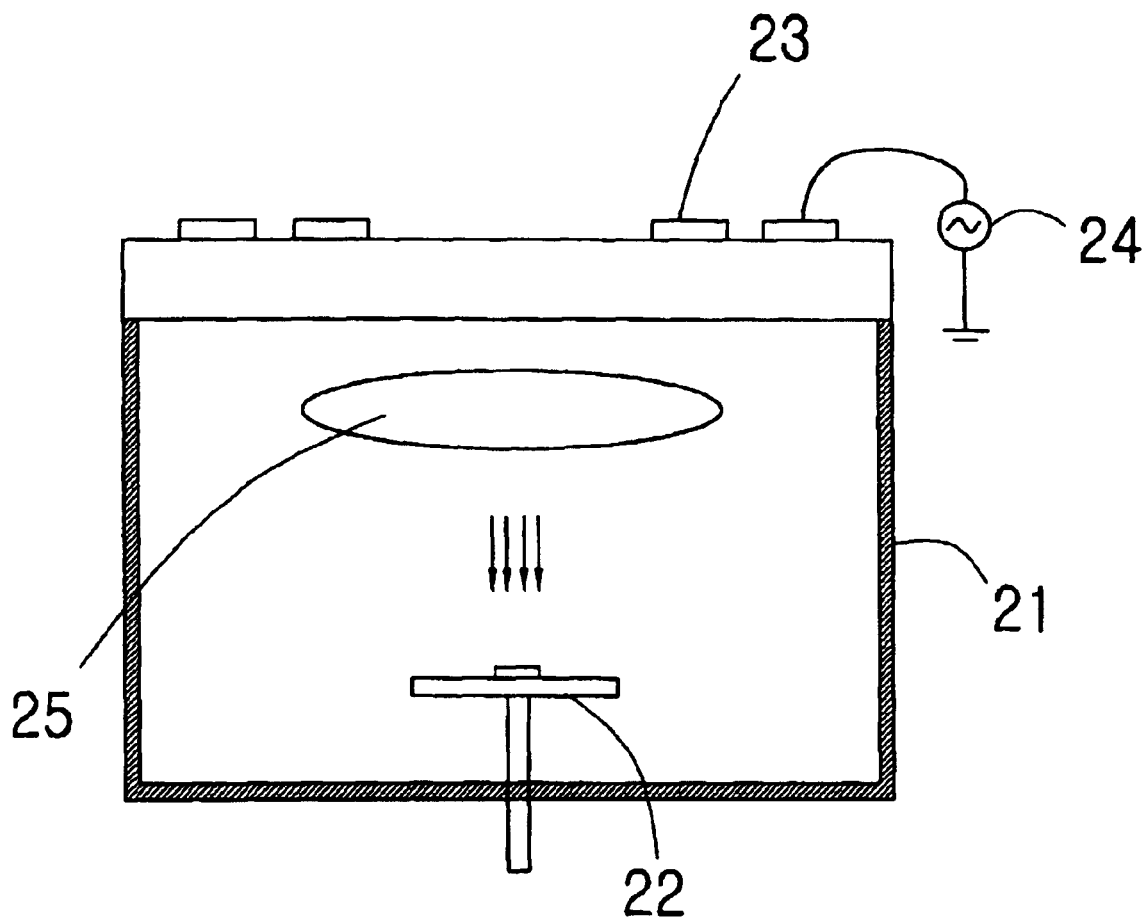
FIG. 2 is a pattern diagram showing a plasma chamber used in the present invention.

FIG. 2 is a block diagram showing an inductive coupled plasma generator used in the present invention. As shown therein, a sample holder 22 for fixing a sample is located in a lower center part of the inside of a chamber 21, and the chamber 21 is grounded.

Also, coil 23 is wound on upper and lower parts of the chamber 21, and RF electric power is supplied from an RF power source 24 to the coil 23.

In above status, when the hydrogen gas is injected into the chamber 21, and then the RF power is supplied to the coil 23, the hydrogen gas becomes plasma status.

The sample shown in FIG. 1b is fixed by the sample holder, and direct current is not applied to the sample holder 22, in order to prevent the exposed low concentration p type HgCdTe layer 2 from being damaged when the plasma is forcedly moved to the sample. And the hydrogen ions or atoms in the plasma 25 are diffused into the exposed low concentration p type HgCdTe layer 2 to be a predetermined depth by maintaining the above status for appropriate time period.

Figure 3:
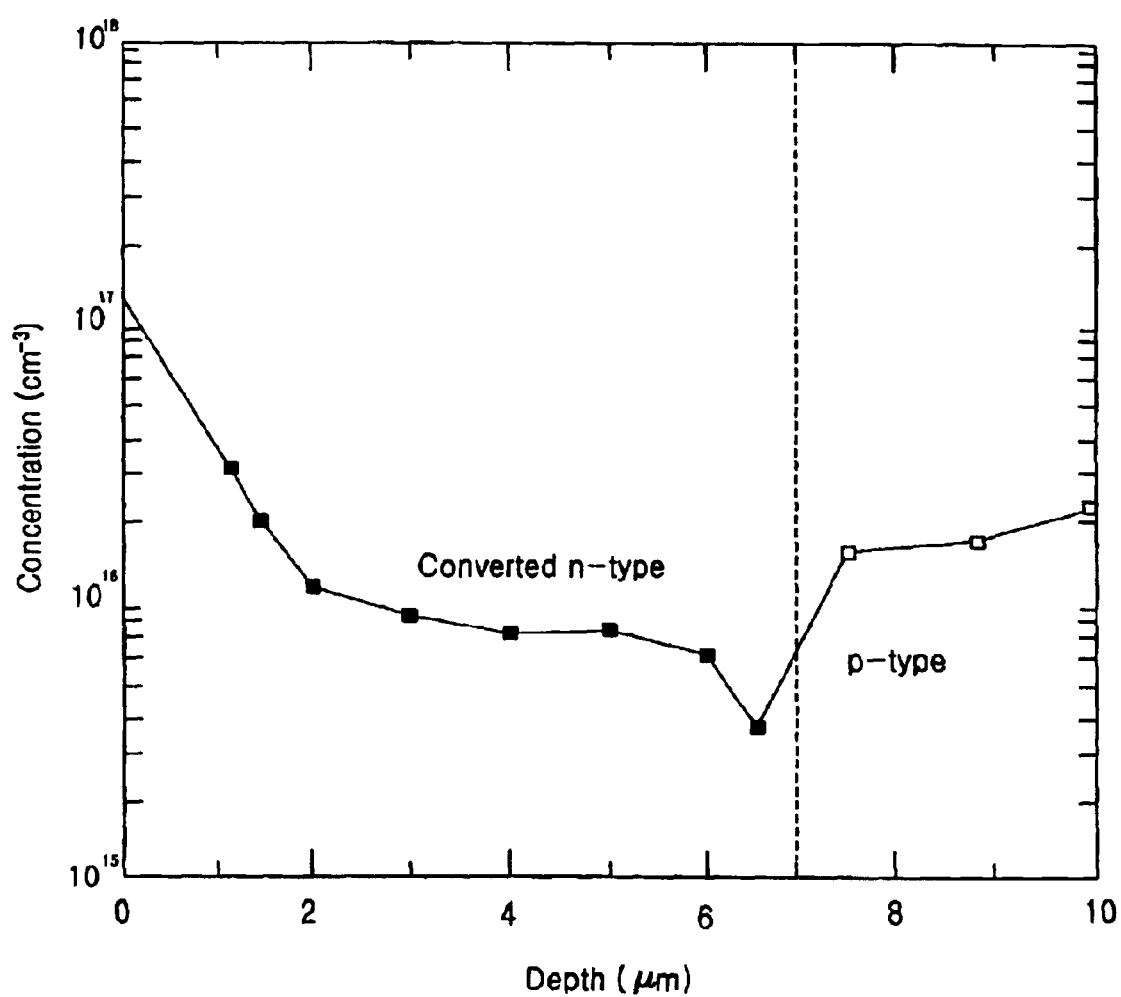
FIG. 3 is a graph showing a concentration distribution according to a depth of p-n junction formed by the present invention.

FIG. 3 is a graph showing conductive type and concentration according to the depth of the low concentration n type HgCdTe layer 4 formed by the diffusion of hydrogen ions or atoms and the low concentration p type HgCdTe layer 2 on lower part thereof. As shown therein, the depth of diffusion of hydrogen ions or atoms into the exposed low concentration p type HgCdTe layer 2 is about 7 $\mu$m and the conductive type of low concentration p type is shown at the depth deeper than 7 $\mu$m.

As the depth of the low concentration n type HgCdTe layer 4, which is formed by diffusing of the hydrogen ions or atoms, becomes deep, the n type concentration is reduced.

The concentration of the n type on the surface of the low concentration n type HgCdTe layer 4 is $10^{17}$ cm$^{-3}$ in the graph.

That is, there are $10^{17}$ donors per 1 cm$^3$ volume, and the concentration is reduced as the depth becomes deeper. Therefore, the concentration near the low concentration p type HgCdTe layer 2 is less than $10^{16}$ cm$^{-3}$.

As shown in above result, the concentration of n type impurities is high on the surface, however, the concentration is low near the boundary of p-n junction which applies actually. And there is no damage by the diffusion on the boundary of the junction.

The leakage current due to tunneling and diffusion can be reduced by the low concentration around the boundary. In addition, since the p-n junction is formed by the diffusion of ions, there is no need of post-processing. Therefore, uniform p-n junction can be obtained.

Also, the depth of the low concentration n type HgCdTe layer 4 can be controlled by controlling the RF power and the processing time, etc.

As described above, according to the present invention, the p-n junction is formed by diffusing the hydrogen ions or atoms, not by injecting the ions, to prevent the low concentration p type HgCdTe layer 2 from being damaged, and to prevent the leakage current.

The mechanism of diffusing the hydrogen ions or atoms on the exposed low concentration p type HgCdTe layer 2 is that the hydrogen ion fills a vacancy (V) of Hg which is operated as an acceptor and the remained impurities are functioned as donor, and can be represented as following reaction formula.

$$2H_{Hg} \leftrightharpoons V_{Hg} + 2H_I$$

Also, in case of HgCdTe substrate for long wavelength, a forbidden band of the substrate is very small, that is, 0.1 eV unlike an HgCdTe substrate for mid-wavelength, wavelength, and therefore, the substrate degradation problems such as minority carrier lifetime, diffusion distance or tunneling characteristics happens more than in the HgCdTe substrate for mid-wavelength.

As in the present invention, when the low concentration n type HgCdTe layer 4 is formed using the diffusion method, an S/N ratio is improved greatly and an RoA value measuring the function of infrared detector is improved greatly.

Next, the passivation layer 3 is selectively etched to remove it as shown in FIG. 1d.

Then, the insulating layer 5 is deposited on entire upper surface of the low concentration n type HgCdTe layer 4 and the low concentration p type HgCdTe layer 2 exposed by removing the passivation layer 3.

The insulating layer 5 is formed by thermal evaporation of ZnS.

Next, as shown in FIG. 1e, the contact hole is formed on the insulating layer 5 using the photolithography process to expose some upper part of the low concentration p type HgCdTe layer 2 and some upper part of the high concentration n type HgCdTe layer 4.

In addition, a metal is deposited and flattened on the entire upper surface of the above structure, and above process is performed two times to form a metal layer 6 which is a plug same as the insulating layer 5 contacting to upper parts of the low concentration n type HgCdTe layer 4 and the low concentration p type HgCdTe layer 2, and having different physical properties.

The components of the metal layer 6 is indium (In) in the metal layer contacting to the low concentration n type HgCdTe layer 4, and gold (Au) in the metal layer contacting to the low concentration p type HgCdTe layer 2.

Next, as shown in FIG. 1e, a plurality of metal layers are deposited and patterned on the entire upper surface of the above structure to form a pad 7 contacting to the metal layers 6 respectively.

The plurality of metal layers are selected from a deposited body of Ni and in, and a deposited body of Ni and Au.

The above low concentration p-n junction is functioned as a photo diode, and is able to detect the infrared ray using changes of current after detecting electric charges generated according to the irradiation of infrared ray.

As described above, according to the present invention, the low concentration n type HgCdTe layer is formed by selectively diffusing hydrogen ions or atoms to be a predetermined depth on some part of the low concentration p type HgCdTe layer using the hydrogen plasma, in order to form the p-n junction of HgCdTe, and therefore, damage of an interface of the p-n junction is prevented to prevent the leakage current. Also, simple processes are used to prevent the fabrication cost from being increased, and to improve the yield.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for manufacturing an infrared detector comprising the steps of:

forming a low concentration p type HgCdTe layer on an upper part of a transparent substrate;

forming a diffusion preventing layer with some part exposed on the low concentration p type HgCdTe layer;

forming a low concentration n type HgCdTe layer by diffusing hydrogen ions and atoms to the exposed low concentration p type HgCdTe layer using an inductive-coupled plasma generator without etching the low concentration p type HgCdTe layer, and forming a p-n junction;

removing the diffusion preventing layer, and forming an insulating layer on entire upper surfaces of the low concentration p type HgCdTe layer and the low concentration n type HgCdTe layer;

forming a contact hole on the insulating layer so as to expose some upper surfaces of the low concentration p type HgCdTe layer and the low concentration n type HgCdTe layer;

forming plugs contacted to upper parts of the low concentration p type HgCdTe layer and the low concentration n type HgCdTe layer in contact holes; and forming a pad contacted to the respective plugs and located on some upper part of the insulating layer to be a predetermined area by depositing and patterning the metal layer on the entire upper surface of the above structure.

2. The method of claim 1, wherein the step of diffusing hydrogen ions and atoms generates hydrogen plasma by applying radio frequency (RF) electric power to a coil using hydrogen gas in a plasma generator as a source gas, and diffuses hydrogen ions and atoms on exposed low concentration HgCdTe layer after exposing the low concentration p type HgCdTe layer, which is masked as the diffusion preventing layer, in the plasma generator.

3. The method of claim 1, wherein the diffusion preventing layer is one of ZnS, CdTe and CdZnTe.

4. The method of claim 1, wherein vacancy of the low concentration p type HgCdTe layer is doped.

5. The method of claim 1, wherein the plug contacting to the low concentration p type HgCdTe layer is Au, and the plug contacting to the low concentration n type HgCdTe layer is In.

6. The method of claim 1, wherein the pad uses a deposited body of Ni and In or uses a deposited body of Ni and Au.

* * * * *